United States Patent
Scribner et al.

[11] Patent Number: 5,936,837
[45] Date of Patent: Aug. 10, 1999

[54] SEMICONDUCTOR COMPONENT HAVING LEADFRAME WITH OFFSET GROUND PLANE

[75] Inventors: Cliff J. Scribner, Chandler; Timothy Lee Olson, Phoenix, both of Ariz.

[73] Assignee: Motorola, Inc., Schaumberg, Ill.

[21] Appl. No.: 08/909,143

[22] Filed: Aug. 11, 1997

[51] Int. Cl.[6] ........................................ H05K 7/20
[52] U.S. Cl. ..................... 361/704; 361/702; 361/717; 361/718; 257/672; 257/676; 257/706; 257/719; 257/796; 257/787
[58] Field of Search .................... 361/704, 709, 361/710, 717, 718, 723; 257/675, 666, 676, 717, 718, 719; 174/51, 52.4, 16.3; 165/80.3

[56] References Cited

U.S. PATENT DOCUMENTS

| | | |
|---|---|---|
| 4,965,654 | 10/1990 | Karner et al. . |
| 5,068,708 | 11/1991 | Newman . |
| 5,291,060 | 3/1994 | Shimizu et al. .................... 257/667 |
| 5,430,331 | 7/1995 | Hamzehdoost et al. ............ 257/796 |
| 5,442,234 | 8/1995 | Liang ................................... 361/709 |
| 5,444,602 | 8/1995 | Banerjee et al. .................... 361/705 |
| 5,444,909 | 8/1995 | Mehr .................................... 257/796 |
| 5,457,340 | 10/1995 | Templeton, Jr. et al. . |
| 5,483,098 | 1/1996 | Joiner, Jr. ........................... 257/676 |
| 5,543,657 | 8/1996 | Diffenderfer et al. ............... 257/666 |
| 5,570,272 | 10/1996 | Variot ................................... 361/723 |

*Primary Examiner*—Leo P. Picard
*Assistant Examiner*—Boris L. Chervinsky
*Attorney, Agent, or Firm*—George C. Chen

[57] ABSTRACT

A semiconductor component includes a leadframe (11, 40) having leads (12, 41) and a ground plane (13, 42) wherein the ground plane (13, 42) has an opening (15, 45). A semiconductor substrate (21) is located in the opening (15, 45) and is approximately coplanar with the ground plane (13, 42). The coplanarity shortens the ground plane wire bonds (23) and improves the electrical performance of the semiconductor component.

13 Claims, 3 Drawing Sheets

SEMICONDUCTOR COMPONENT HAVING LEADFRAME WITH OFFSET GROUND PLANE

BACKGROUND OF THE INVENTION

This invention relates, in general, to semiconductor components, and more particularly, to packaged semiconductor components.

In many semiconductor components, the flag of a leadframe is used to support a semiconductor die. The flag is also often used as a ground plane for the semiconductor component. Therefore, the back of the semiconductor die is mounted on or bonded to the flag, and the top of the semiconductor die is wire bonded to the flag.

Solder is typically used to adhere the semiconductor die to the flag, but the solder often bleeds or runs-out from underneath the semiconductor die. For manufacturability and reliability reasons, the ground plane wire bonds are attached to the flag at a distance from the semiconductor die that is greater than the typical solder run-out. However, the longer wire bonds increase the ground plane inductance and reduce both the efficiency and the power out of the semiconductor component. This degradation in electrical performance is more significant when the semiconductor component is operated at high frequencies such as, for example, at operating frequencies of greater than approximately eight hundred megahertz.

Accordingly, a need exists for a semiconductor component having shorter ground plane wire bonds and improved efficiency and power out characteristics. The semiconductor component should also be easily and inexpensively manufactured.

DETAILED DESCRIPTION OF THE DRAWINGS

Figure 1:
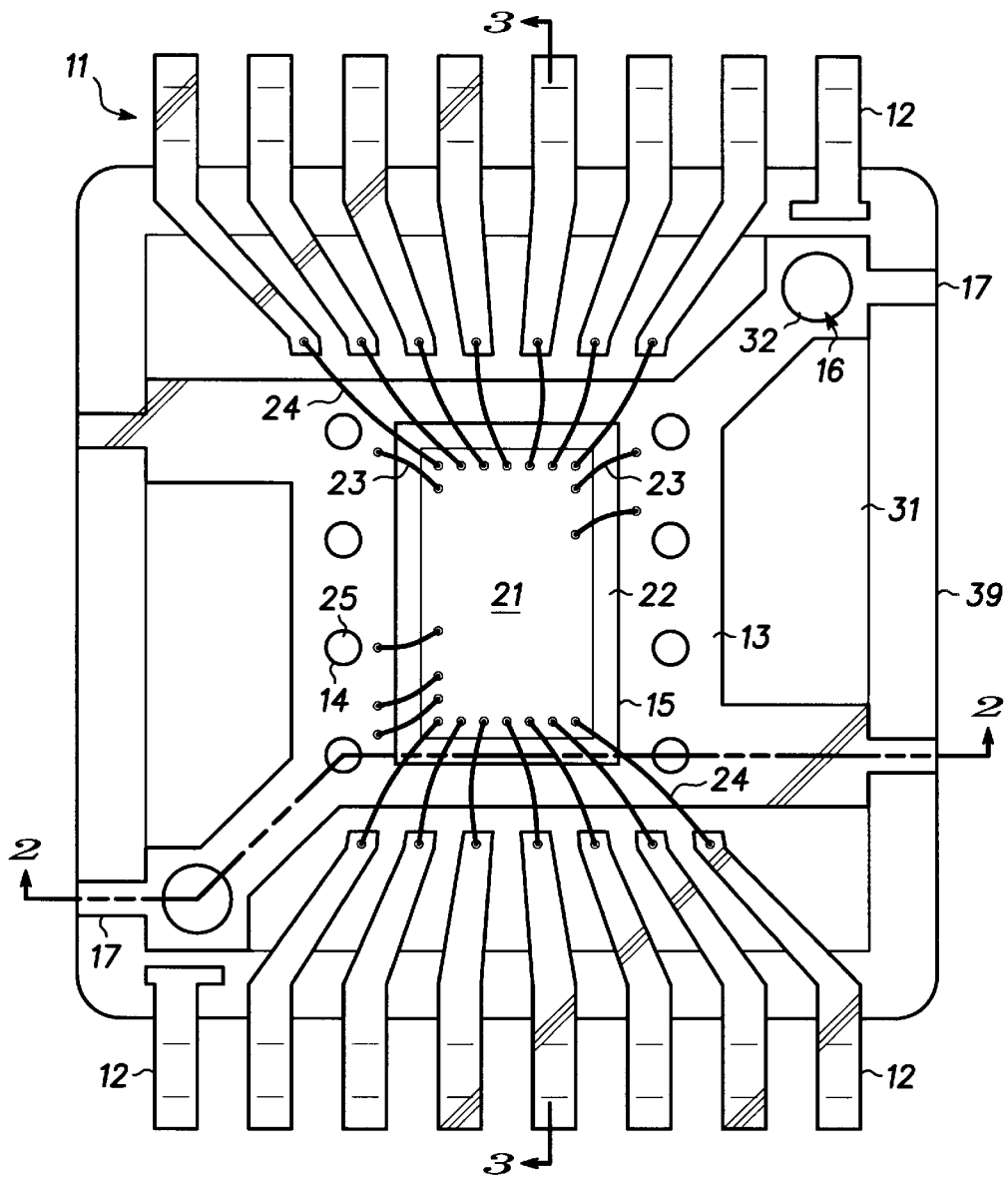
FIG. 1 illustrates a cut-away top view of an embodiment of a semiconductor component in accordance with the present invention.
Figure 2:
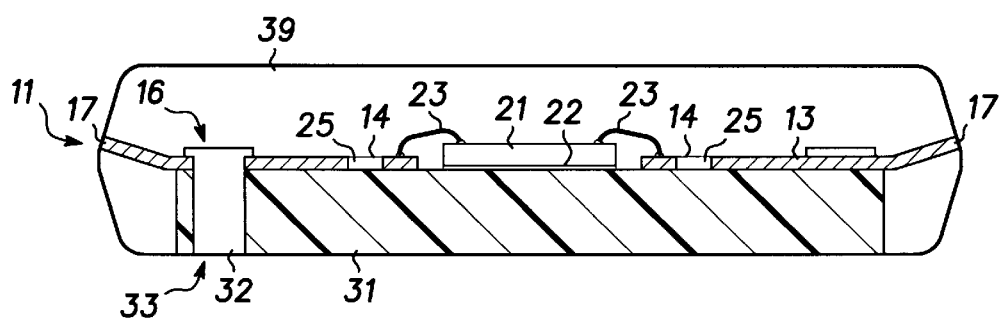
FIG. 2 portrays a cross-sectional view of the semiconductor component of FIG. 1 taken along a section line 2—2.
Figure 3:
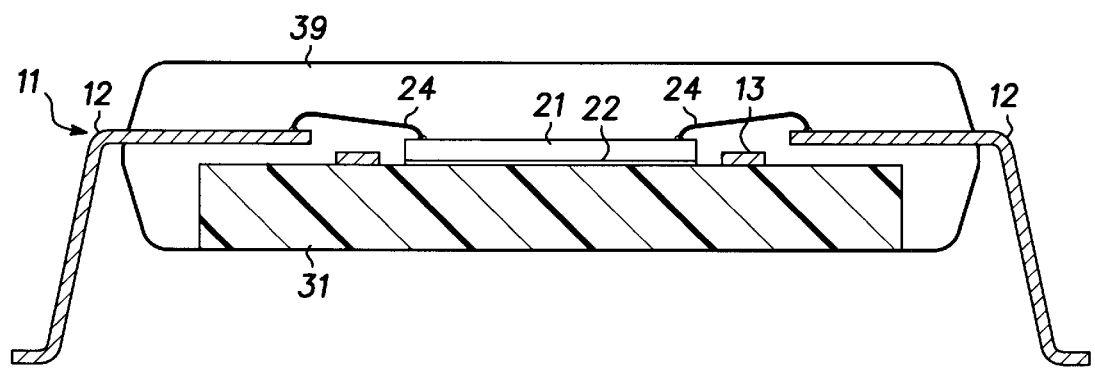
FIG. 3 depicts a cross-sectional view of the semiconductor component of FIG. 1 taken along a section line 3—3.

FIG. 1 illustrates a cut-away top view of an electronic or semiconductor component 10. FIG. 2 portrays a cross-sectional view of component 10 taken along a section line 2—2 in FIG. 1. FIG. 3 depicts a cross-sectional view of component 10 taken along a section line 3—3 in FIG. 1. The same elements in FIGS. 1, 2, and 3 are represented by the same element numbers.

Component 10 includes a leadframe 11, which comprises electrical leads 12 and ground plane 13. Dam bars and tie bars of leadframe 11 have already been removed in FIGS. 1, 2, and 3. In the preferred embodiment, all portions of leadframe 11 are simultaneously formed from a single piece of metal. As an example, leadframe 11 can be stamped or otherwise excised from a sheet of copper alloy or the like having a thickness of approximately 125–625 micrometers. The sheet of copper alloy can be plated with nickel palladium before or after the stamping process.

Ground plane 13 of leadframe 11 has an opening 15 and holes 14 and 16. Opening 15 and holes 14 and 16 are formed in ground plane 13 during the aforementioned stamping process and are entirely defined by ground plane 13. Ground plane 13 is deformed to be non-coplanar with leads 12 after the stamping process used to form leadframe 11. As depicted in FIG. 3, ground plane 13 is offset or downset from leads 12. In the preferred embodiment, ground plane 13 is downset by approximately 200–500 micrometers from leads 12.

As depicted in FIG. 2, an interior portion of ground plane 13 is planar, but exterior portions 17 of ground plane 13 are bent. Portions 17 are connected to tie bars (not shown) of leadframe 11, and the tie bars are coplanar with leads 12. As discussed earlier, the tie bars of leadframe 11 have previously been removed from component 10 in FIGS. 1, 2, and 3.

A subsequent step in making or manufacturing component 10 includes providing a heatsink 31, which includes holes 33 portrayed in FIG. 2. Heatsink 31 can be stamped or otherwise shaped and excised from a copper slug or the like. Then, all surfaces of heatsink 31 can be plated with a layer of, for example, nickel and palladium. Preferably, a top surface of heatsink 31 that is subsequently used to support a semiconductor substrate is not plated in order to improve the subsequent adhesion of a molding compound to heatsink 31. Heatsink 31 can be plated before or after being stamped.

Heatsink 31 is disposed on, positioned adjacent to, or mounted on leadframe 11. Heatsink 31 is aligned underneath holes 14 and 16 and opening 15 of ground plane 13. In particular, holes 33 of heatsink 31 are aligned to holes 16 of ground plane 13. Pins 32 are disposed or inserted into holes 16 and 33 to mechanically couple together ground plane 13 and heatsink 31.

During the mechanical coupling process, ground plane 13 is deformed or pushed back towards leads 12 a distance of approximately 20–100 micrometers by heatsink 31. This pre-loading of ground plane 13 ensures reliable physical and electrical contact between ground plane 13 and heatsink 31. After the mechanical coupling process, ground plane 13 remains approximately 200–300 micrometers downset from leads 12.

In an undepicted alternative embodiment, heatsink 31 can include a post or stake, which can be used in place of pins 32. For example, after the aforementioned stamping of heatsink 31, an additional stamping or pressing process can be used to extrude material from heatsink 31 to form an integral stake extending from heatsink 31. The stake is then inserted into hole 16 of ground plane 13. The distal end or tip of the stake extends out of hole 16, and a swedging process is used to deform or flatten the tip of the stake to be wider than hole 16. Thus, heatsink 31 is alternatively mechanically coupled or secured to leadframe 11.

As portrayed in FIGS. 1, 2, and 3, heatsink 31 preferably has a larger footprint than substrate 21 and ground plane 13 to enhance the heat dissipation characteristics of component 10. Due to the large size of heatsink 31, leads 12 must be elevated or offset from ground plane 13 such that leads 12 do not physically contact and are not electrically shorted to heatsink 31 and ground plane 13. In an undepicted alternative embodiment where the heatsink has a smaller footprint than the ground plane, the electrical leads may be coplanar with the ground plane. However, even in this alternative embodiment, the ground plane is still preferably downset from the leads for manufacturability reasons related to wire bonding.

After the mechanical coupling step, heatsink 31 can be metallurgically coupled or adhered to leadframe 11 by disposing an adhesive 25 into holes 14 of ground plane 13. In the preferred embodiment, adhesive 25 is an electrically conductive material such as, for example, solder. As shown in FIG. 2, portions of adhesive 25 will be drawn by capillary action between ground plane 13 and heatsink 31.

An adhesive 22 is disposed in opening 15 of ground plane 13. Adhesive 22 can be different from adhesive 25, but adhesive 22 is preferably comprised of the same material as adhesive 25 and is preferably disposed in opening 15 during the same assembly step as when adhesive 25 is disposed in holes 14. Adhesive 22 is used to couple or adhere a semiconductor substrate 21 to heatsink 31.

Semiconductor substrate 21 is disposed in, positioned in, or aligned to opening 15 of ground plane 13. Substrate 21 is adjacent to or mounted on heatsink 31; substrate 21 is not supported by ground plane 13. Substrate 21 is comprised of a semiconductor material such as, for example, silicon or gallium arsenide. A semiconductor device such as, for example, a power transistor, an integrated circuit, or the like, is located in substrate 21. In the preferred embodiment, substrate 21 has a thickness of approximately 200–300 micrometers so that substrate 21 is not too thin or fragile. However, in an alternative embodiment, substrate 21 can have a thickness of approximately 100 microns or less. Other details of the semiconductor device and substrate 21 are not illustrated in FIGS. 1, 2, and 3 to simplify the explanation of component 10.

Substrate 21 is mounted onto heatsink 31 such that a top surface of substrate 21 is approximately coplanar with a top surface of ground plane 13. The purpose for the coplanarity is to shorten the length of the wire bonds used to electrically couple substrate 21 and ground plane 13, as explained hereinafter. Because both ground plane 13 and substrate 21 are mounted onto heatsink 31, the thicknesses of ground plane 13 and substrate 21 are preferably approximately equal to each other in order to achieve the coplanarity between ground plane 13 and substrate 21. Slight differences in thickness may be desired to compensate for adhesive 22 under substrate 21.

In the preferred embodiment, the offset between substrate 21 and ground plane 13 is less than approximately 100 micrometers, and the offset between substrate 21 and leads 12 is greater than approximately 150 micrometers. The offsets are measured by perpendicular distances between the three parallel planes formed by each of leads 12, ground plane 13, and substrate 21.

After disposing substrate 21 onto adhesive 22 and heatsink 31, portions of adhesive 22 will bleed or run-out from under substrate 21 toward ground plane 13. Portions of adhesive 22 may also be drawn by capillary action between ground plane 13 and heatsink 31. Accordingly, adhesive 22 can also be used to physically and electrically couple ground plane 13 to heatsink 31. In an alternative embodiment, holes 14 are not included in ground plane 13, and adhesive 25 is not used in component 10. Instead, only adhesive 22 in opening 15 is used to metallurgically couple ground plane 13 to heatsink 31.

Next, substrate 21 is wire bonded to leadframe 11. In particular, wire bonds 24 electrically couple substrate 21 to leads 12, and wire bonds 23 electrically couple substrate 21 to ground plane 13. Portions of wire bonds 23 physically contact ground plane 13 at a location closer to substrate 21 than holes 14 of ground plane 13. The portions of wire bonds 23 are located between holes 14 and opening 15 of ground plane 13. Wire bonds 23 and 24 can be coupled to the same sides of substrate 21. However, to improve the manufacturing yields of component 10, wire bonds 23 and wire bonds 24 are preferably coupled to different sides of substrate 21, as depicted in FIG. 1.

In the prior art, ground plane wire bonds are coupled to the same surface that supports the semiconductor substrate. However, in component 10, wire bonds 23 are not coupled to heatsink 31 on which substrate 21 is mounted. Instead, wire bonds 23 are coupled to an elevated surface of ground plane 13. Therefore, wire bonds 23 are shorter in a vertical direction compared to the prior art ground plane wire bonds. Wire bonds 23 are also shorter in a horizontal direction compared to the prior art ground plane wire bonds because the solder run-out problems of the prior art are eliminated by using the combination of ground plane 13 and heatsink 31, as explained earlier. In the preferred embodiment, wire bonds 23 have a length of less than approximately 400 micrometers, which is significantly shorter than the prior art ground plane wire bonds of greater than approximately 600 micrometers. Therefore, the ground plane inductance of component 10 is smaller compared to the prior art, and the power out and efficiency of component 10 is improved over the prior art.

After the electrical coupling steps, an encapsulant or packaging material 39 is provided or disposed around substrate 21 and leadframe 11. Material 39 is used to protect the semiconductor device in substrate 21 and wire bonds 23 and 24 from moisture, corrosion, contamination, physical impact, or the like. Material 39 is preferably a high pressure, injection mold compound or the like. As an example, a bi-phenol compound can be used for material 39. In an alternative embodiment, a hermetically sealed metallic package instead of packaging material 39 can be used to protect or encapsulate component 10.

After the encapsulation step, the dam bars and tie bars are removed from leadframe 11. Then, leads 12 are bent to form a surface mount device or the like, and component 10 can be mounted onto a circuit board (not shown).

Figure 5:
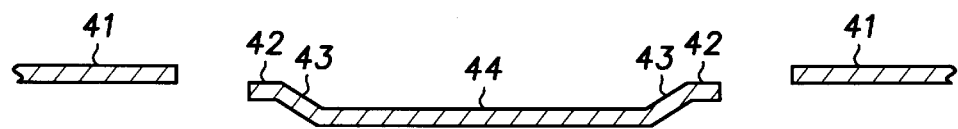
FIG. 5 represents a cross-sectional view of a portion of the leadframe of FIG. 4 taken along a section line 5—5.
Figure 4:
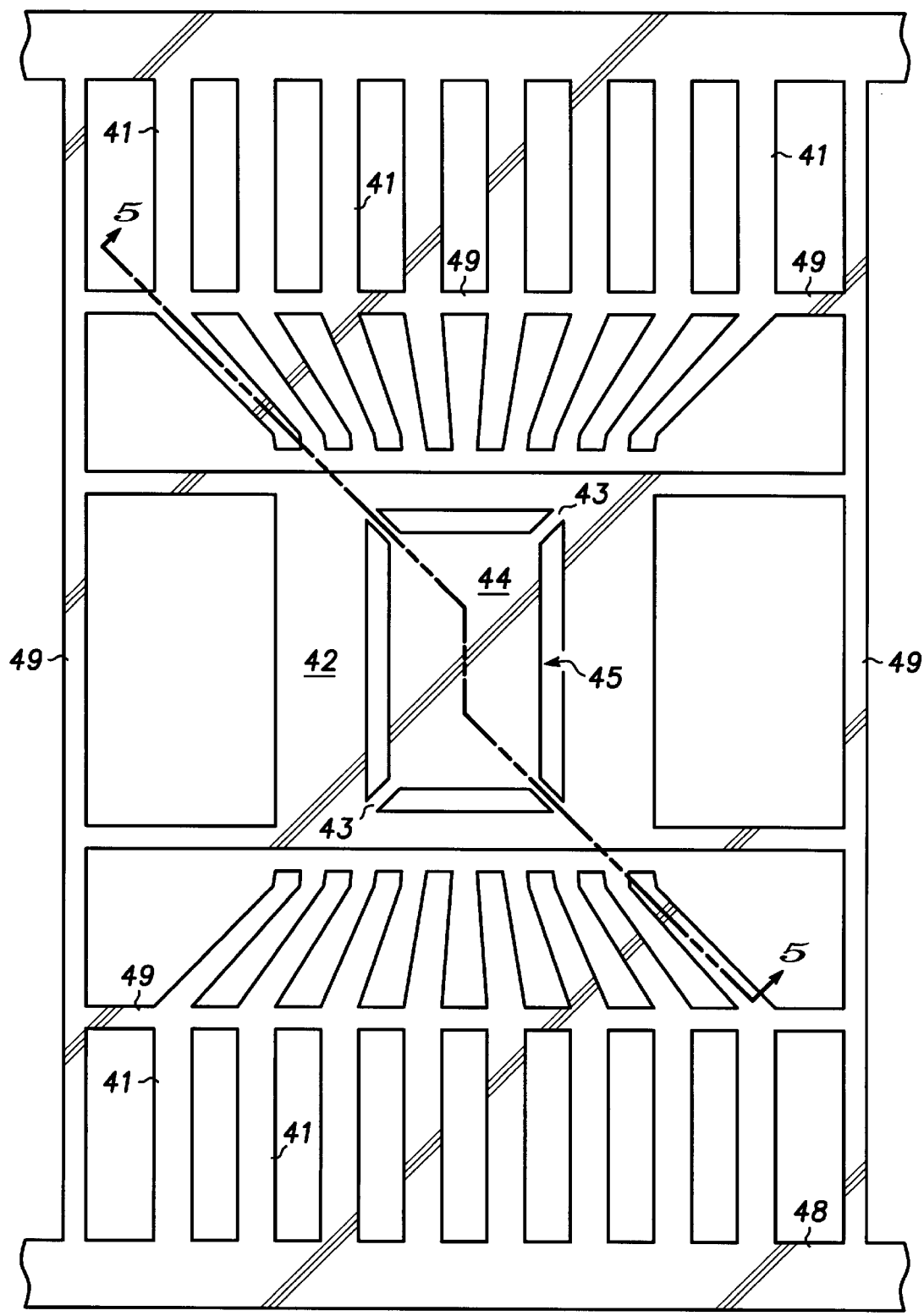
FIG. 4 illustrates a top view of an alternative embodiment of a leadframe in accordance with the present invention.

FIG. 4 illustrates a top view of a leadframe 40, which is an alternative embodiment of leadframe 11 in FIGS. 1, 2, and 3. FIG. 5 represents a cross-sectional view of a portion of leadframe 40 taken along a section line 5—5 in FIG. 4. The same reference numbers are used to represent the same elements in FIGS. 4 and 5.

Leadframe 40 is preferably comprised of the same material as leadframe 11 in FIGS. 1, 2, and 3, and leadframe 40 can be manufactured using the same processes as leadframe 11. Leadframe 40 has electrical leads 41 and a ground plane 42, which are similar to leads 12 and ground plane 13, respectively, of leadframe 11. Leadframe 40 also has tie bars 48 and dam bars 49, which are used to physically couple and support leads 41 and ground plane 42 within leadframe 40.

Leadframe 40 is typically used for a semiconductor component that does not use as much power as component 10 in FIGS. 1, 2, and 3. Unlike leadframe 11, leadframe 40 has a flag 44, which is used to support a semiconductor die or chip. Portions 43 of leadframe 40 physically and electrically couple flag 44 to ground plane 42.

As illustrated in FIG. 5, flag 44 is non-coplanar with ground plane 42 and leads 41. Flag 44 is preferably downset by a distance that is approximately equal to the thickness of a semiconductor die mounted on flag 44. In this manner, the semiconductor die will be approximately coplanar with ground plane 42. Thus, the wire bonds used to electrically couple the semiconductor die and ground plane 42 will be shortened compared to the prior art.

Ground plane 42 can be coplanar with leads 41, but is preferably non-coplanar with leads 41 for reasons explained earlier. Therefore, in the preferred embodiment, leadframe 40 is a tri-level leadframe wherein leads 41, ground plane 42, and flag 44 form three separate substantially parallel planes or levels.

The concept of using a multi-level leadframe, as suggested by leadframe 40 in FIG. 4 and leadframe 11 in FIGS. 1, 2, and 3, can also be extended to ceramic leadframes that use metallic traces.

Therefore, an improved semiconductor component is provided and overcomes the disadvantages of the prior art. The semiconductor component has a multi-level leadframe that uses shorter ground plane wire bonds, which reduce the ground plane inductance and improve the efficiency and power out characteristics of the semiconductor component. The multi-level leadframe also improves the manufacturability of the semiconductor component by eliminating the detrimental effects of solder run-out from underneath the semiconductor die. In fact, the solder run-out is advantageously used to metallurgically adhere the heatsink to the leadframe.

We claim:

1. A semiconductor component comprising:
   a leadframe having a ground plane and leads wherein the leads are comprised of a metal and wherein the ground plane is comprised of the metal and wherein the ground plane is offset from the leads and wherein the ground plane has an opening and wherein the ground plane forms a continuous perimeter around the opening and wherein the leads are absent over the ground plane;
   a semiconductor substrate adjacent to the leadframe and located within the opening of the ground plane wherein the semiconductor substrate is approximately coplanar with the ground plane and wherein the opening of the ground plane is larger than the semiconductor substrate; and
   a heatsink adjacent to the leadframe wherein the semiconductor substrate and the ground plane are mounted on a surface of the heatsink and wherein the surface of the heatsink is offset from the ground plane and the leads.

2. The semiconductor component of claim 1 further comprising an adhesive between the semiconductor substrate and the heatsink wherein the adhesive physically couples together the semiconductor substrate and the heatsink and physically couples together the ground plane and the heatsink.

3. The semiconductor component of claim 1 further comprising wire bonds electrically coupling the semiconductor substrate and the ground plane wherein the wire bonds each have a length of less than approximately 400 micrometers and greater than 0 micrometers.

4. The semiconductor component of claim 1 further comprising tie bars and dam bars wherein the leads and the ground plane are coupled together by the tie bars and the dam bars.

5. An electronic component comprising:
   a leadframe having leads and a ground plane with an opening and a hole wherein the ground plane and the leads are offset from each other;
   a semiconductor substrate in the opening of the ground plane; and
   wire bonds electrically coupling the semiconductor substrate and the ground plane wherein portions of the wire bonds physically contact a region of the ground plane and wherein the region of the ground plane is located between the opening and the hole of the ground plane.

6. An electronic component comprising:
   a leadframe having leads and a ground plane with an opening and a hole wherein the ground plane and the leads are offset from each other;
   a semiconductor substrate in the opening of the ground plane;
   a mounting surface offset from the ground plane wherein the semiconductor substrate is mounted onto the mounting surface;
   an adhesive in the hole of the ground plane; and
   a heatsink under the hole of the ground plane wherein the adhesive couples the ground plane to the heatsink and wherein a surface of the heatsink is the mounting surface.

7. The electronic component of claim 6 wherein the adhesive is in the opening and adheres the semiconductor substrate to the heatsink.

8. An electronic component comprising:
   a leadframe having leads and a ground plane with an opening and a hole wherein the ground plane and the leads are offset from each other;
   a semiconductor substrate in the opening of the ground plane;
   an adhesive in the opening of the ground plane; and
   a heatsink under the opening of the ground plane wherein the adhesive couples the semiconductor substrate to the heatsink and couples the ground plane to the heatsink.

9. An electronic component comprising:
   a leadframe having leads and a ground plane wherein the ground plane is comprised of a metal and has a hole and an opening and wherein the leads are comprised of the metal and wherein the ground plane is non-coplanar to the leads; and
   a semiconductor substrate in the opening of the ground plane wherein the semiconductor substrate is offset from the ground plane by less than approximately one hundred micrometers and down to a lower limit of zero micrometers.

10. The electronic component of claim 9 further comprising a heatsink adjacent to the ground plane wherein the semiconductor substrate is mounted on a surface of the heatsink and wherein the surface of the heatsink is non-coplanar with the leads and the ground plane.

11. An electronic component comprising:
   a leadframe having leads and a ground plane wherein the ground plane is comprised of a metal and has a hole and an opening and wherein the leads are comprised of the metal and wherein the ground plane is non-coplanar to the leads;
   a semiconductor substrate in the opening of the ground plane wherein the semiconductor substrate is offset from the ground plane by less than approximately one hundred micrometers and down to a lower limit of zero micrometers;
   a first wire bond electrically coupling the semiconductor substrate and the ground plane wherein a portion of the first wire bond physically contacts the ground plane and is located between the hole of the ground plane and the opening of the ground plane and wherein the first wire bond overlies a first edge of the semiconductor substrate; and
   a second wire bond electrically coupling the semiconductor substrate and the leads wherein the second wire bond overlies a second edge of the semiconductor substrate wherein the second edge is different from the first edge.

12. An electronic component comprising:

a leadframe having leads and a ground plane wherein the ground plane is comprised of a metal and has a hole and an opening and wherein the leads are comprised of the metal and wherein the ground plane is non-coplanar to the leads;

a semiconductor substrate in the opening of the ground plane wherein the semiconductor substrate is offset from the ground plane by less than approximately one hundred micrometers and down to a lower limit of zero micrometers;

a heatsink adjacent to the ground plane wherein the semiconductor substrate is mounted on a surface of the heatsink and wherein the surface of the heatsink is non-coplanar with the leads and the ground plane; and a solder in the hole of the ground plane wherein the solder adheres the ground plane to the heatsink.

13. The electronic component of claim 12 wherein the solder is located in the opening of the ground plane wherein the solder adheres the semiconductor substrate and the ground plane to the heatsink and further comprising a packaging material encapsulating the semiconductor substrate wherein a portion of the heatsink is exposed outside of the packaging material.

* * * * *